US009568539B2

(12) United States Patent
Pouzalgues

(10) Patent No.: US 9,568,539 B2
(45) Date of Patent: Feb. 14, 2017

(54) DEVICE FOR MEASURING ELECTROMAGNETIC FIELD SENSOR GAIN

(71) Applicant: Commissariat à l'énergie atomique et aux énergies alternatives, Paris (FR)

(72) Inventor: Romain Pouzalgues, Miers (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 141 days.

(21) Appl. No.: 14/424,290

(22) PCT Filed: Sep. 16, 2013

(86) PCT No.: PCT/EP2013/069176
§ 371 (c)(1),
(2) Date: Feb. 26, 2015

(87) PCT Pub. No.: WO2014/041177
PCT Pub. Date: Mar. 20, 2014

(65) Prior Publication Data
US 2015/0219712 A1   Aug. 6, 2015

(30) Foreign Application Priority Data
Sep. 17, 2012 (FR) .................... 12 58697

(51) Int. Cl.
*G01R 31/26* (2014.01)
*G01R 29/08* (2006.01)
(Continued)

(52) U.S. Cl.
CPC ....... *G01R 31/2656* (2013.01); *G01R 29/0878* (2013.01); *G01R 29/105* (2013.01); *H01Q 9/40* (2013.01)

(58) Field of Classification Search
CPC ........................................... H01Q 9/28
See application file for complete search history.

(56) References Cited

U.S. PATENT DOCUMENTS 7,286,095 B2 * 10/2007 Parsche .......... H01Q 21/29
343/700 MS
2004/0233118 A1 * 11/2004 Jocher ............ H01Q 1/36
343/773

(Continued)

FOREIGN PATENT DOCUMENTS

EP    1 063 528 A1   12/2000
EP    1 722 243 A1   11/2006
(Continued)

OTHER PUBLICATIONS

Search Report issued in French Patent Application No. FR 12 58697 dated Jul. 4, 2013.
(Continued)

*Primary Examiner* — Clayton E Laballe
*Assistant Examiner* — Noam Reisner
(74) *Attorney, Agent, or Firm* — Pearne & Gordon LLP

(57) ABSTRACT

The invention relates to a device for measuring electromagnetic field sensor (CP) gain comprising an electromagnetic wave source and an antenna connected to the electromagnetic wave and radiating an electromagnetic field in the direction of the sensor, characterized in that the antenna is a monocone antenna comprising a plane conductive element (P) having a first face and a second face opposite the first face and a cone-shaped conductive part (C) situated on the side of the first face. Applications to gain measurements over very broad frequency bands.

5 Claims, 7 Drawing Sheets

(51) Int. Cl.
*H01Q 9/40* (2006.01)
*G01R 29/10* (2006.01)
*G01R 31/265* (2006.01)

(56) References Cited

U.S. PATENT DOCUMENTS

| | | | |
|---|---|---|---|
| 2005/0122274 A1 | 6/2005 | Marsan | |
| 2009/0219217 A1* | 9/2009 | Kitada | G01R 29/105 343/703 |
| 2012/0052816 A1* | 3/2012 | Chang | H04W 24/06 455/67.12 |

FOREIGN PATENT DOCUMENTS

| | | |
|---|---|---|
| JP | 2004-129209 A | 4/2004 |
| JP | 2008-047994 A | 2/2008 |
| WO | 2009/143216 A1 | 11/2009 |

OTHER PUBLICATIONS

International Search Report issued in Application No. PCT/EP2013/069176 dated Feb. 24, 2014.
Written Opinion issued in Application No. PCT/EP2013/069176 dated Feb. 24, 2014.
International Preliminary Report on Patentability issued in Application No. PCT/EP2013/069176 dated Dec. 19, 2014.
A. Frandsen et al., "Control of scattering from probes for near-field antenna measurements by use of skirt" Electronics Letters, vol. 40, No. 5, Mar. 4, 2004.
Steven D. Keller., "Wire-Frame Monocone Antenna for Direction-Finding Applications on Unmanned Aerial Vehicle Platform" IEEE Antennas and Propagation Magazine, vol. 53, No. 1, Feb. 1, 2011.
Huiqing Zhai et al., "A Quasi-Planar Conical Antenna With Broad Bandwidth and Omnidirectional Pattern for Ultrawideband Radar Sensor Network Applications" IEEE Transactions on Antennas and Propagation, vol. 58, No. 11, Nov. 2010.
Ronald R. Delyser et al., "Figure of Merit for Low Frequency Anechoic Chambers Based on Absorber Reflection Coefficients" IEEE Transactions on Electromagnetic Compatibility, vol. 38, No. 4, Nov. 1996.

* cited by examiner

DEVICE FOR MEASURING ELECTROMAGNETIC FIELD SENSOR GAIN

FIELD OF THE INVENTION AND PRIOR ART

The invention relates to a device for measuring electromagnetic field sensor gain.

The term electromagnetic field sensor denotes, for example, an antenna suitable for receiving or transmitting electromagnetic waves.

The invention applies to the measurement of free space or wall electromagnetic field sensor gains, in broad frequency bands, for example the 100 MHz-40 GHz band.

At the present time, there are various types of devices suitable for measuring electromagnetic field sensor gain.

Of the known devices, some only measure the gain of free space or wall sensors over relatively narrow frequency bands (typically around 1 GHz). These devices consist of cells such as Crawford cells or GTEM ("Gigahertz Transverse ElectroMagnetic") cells.

Further known systems perform characterisations of systems radiating in free space in three dimensions. These systems make measurements in broader frequency bands than those of the cells mentioned above. However, in order to cover broad frequency bands, these systems require the use of a plurality of different transmission antennas, each transmission antenna radiating an electromagnetic wave in a fraction of the useful frequency band. This results in a complex and costly measurement device.

The device according to the invention does not have these drawbacks.

DESCRIPTION OF THE INVENTION

Indeed, the invention relates to a device for measuring electromagnetic field sensor gain comprising an electromagnetic wave source and an antenna connected to the electromagnetic wave and radiating an electromagnetic field in the direction of the sensor. The antenna is a monocone antenna comprising a plane conductive element having a first face and a second face opposite the first face and a cone-shaped conductive part situated on the side of the first face. The first face of the plane conductive element and an external face of the cone-shaped conductive part define, with a wall covered with absorbent included in the measurement device and surrounding the cone-shaped part, an anechoic chamber wherein the sensor is positioned. The measurement device further comprises a system for measuring voltage connected to the sensor and suitable for measuring a voltage output by the sensor and a computing device suitable for computing a sensor gain on the basis of the voltage measurements output by the voltage measurement system.

According to an additional feature of the invention, an opening is made in the plane conductive element and mechanical means suitable for attaching one end of a coaxial cable onto the plane conductive element are attached to the second face of the plane conductive element, at the opening made in the plane conductive element, the mechanical means having an opening aligned with the opening made in the plane conductive element and comprising a connector electrically connected to the end of the coaxial cable, the connector having a central wire attached to a first end of a connection part wherein the second end is attached to one end of the cone-shaped conductive part.

According to a further additional feature of the invention, the plane conductive element consists of a plate furnished with an opening and a flexible metal foil attached to the plate which fills the opening made in the plate, the flexible foil being furnished with an opening forming the opening of the plane conductive element, the mechanical means being attached to the flexible foil.

According to a further additional feature of the invention, the flexible metal foil is attached to the plate by a metallic adhesive tape.

According to a further additional feature of the invention, the plane conductive element is furnished with a revolving plate whereon the sensor is positioned.

According to a further additional feature of the invention, the cone-shaped conductive part consists of two separable parts screwed onto each other, a first part comprising the apex of the cone and the second part forming the body of the cone.

According to a further additional feature of the invention, the cone-shaped conductive part is held above the plane element by a cable suspension system.

BRIEF DESCRIPTION OF THE FIGURES

Further features and advantages of the invention will emerge on reading one preferential embodiment described with reference to the attached figures, wherein.

Throughout the figures, the same references denote the same elements.

DETAILED DESCRIPTION OF A PREFERENTIAL EMBODIMENT OF THE INVENTION

Figure 1:
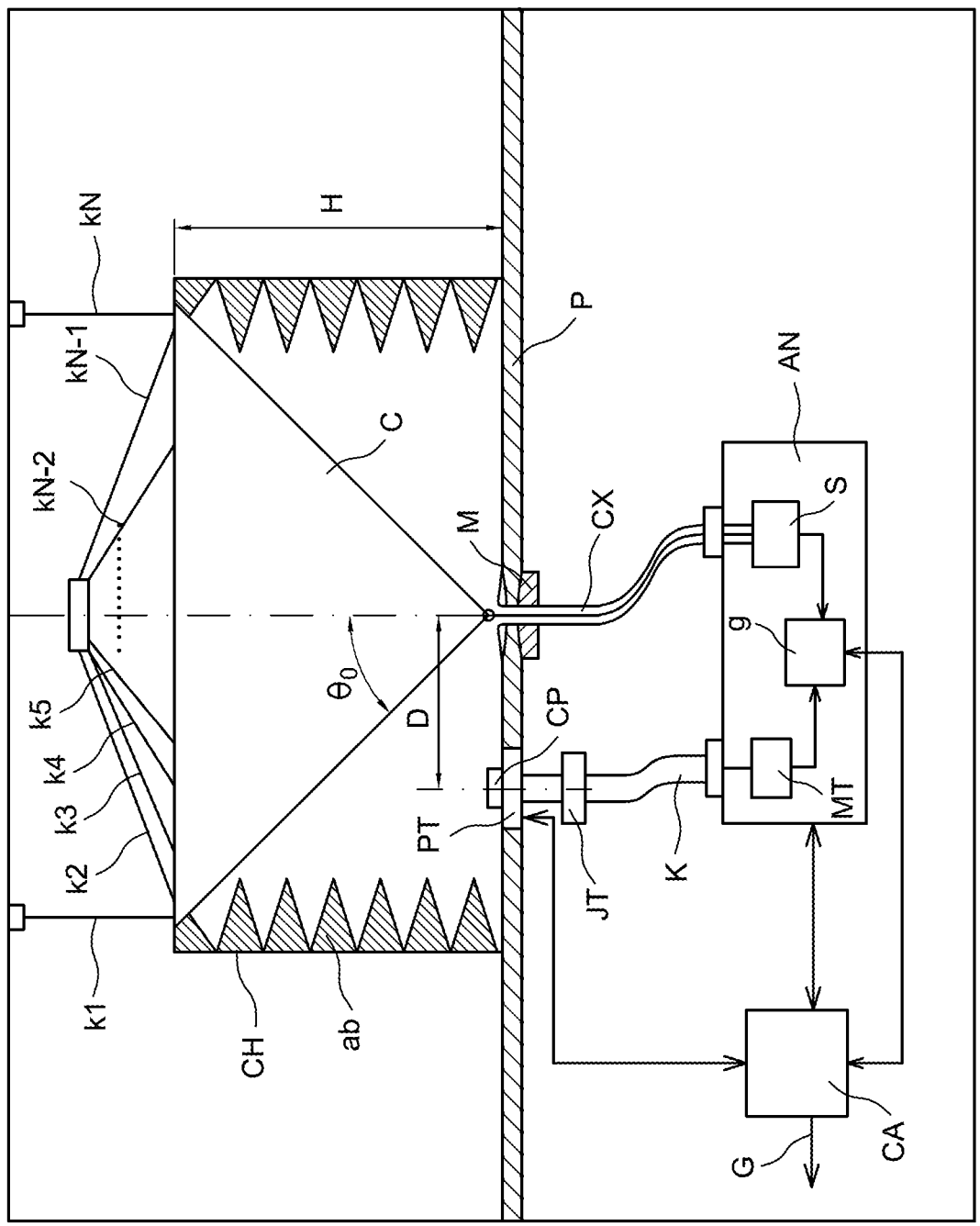
FIG. 1 represents a schematic diagram of the device for measuring electromagnetic field sensor gain according to the invention.

FIG. 1 represents a schematic diagram of the device for measuring electromagnetic field gain according to the invention.

The measurement device comprises the following essential elements:

- a monocone antenna consisting of a cone-shaped conductive part C and an electrically conductive plane element P,
- at least one wall covered with absorbent and forming, with the cone-shaped part and the electrically conductive plane element, an anechoic chamber wherein the sensor is positioned,
- an electromagnetic wave source S,
- a coaxial cable CX connecting the electromagnetic wave source S to the monocone antenna,
- a voltage measurement system MT suitable for measuring the voltage output by the sensor,
- a gain computing system g suitable for measuring the voltage gain of the sensor (ratio between the voltage output by the voltage measurement system and the incident voltage applied to the monocone antenna input), and a computer CA suitable for computing the gain G of the sensor on the basis of the voltage gain computed by the gain computing system g.

The sensor CP for which the gain is to be determined is positioned in the space situated between the electrically conductive plane element P and the surface of the cone-shaped conductive part C, for example on the plane element P itself. In one particular embodiment of the invention, the electromagnetic wave source S, the voltage measurement system MT and the gain computing system g are electronic circuits of a network analyser AN. In one particular alternative embodiment of the invention, an amplifier amplifies the signal output by the network analyser.

A cable suspension system k1, k2, k3, k4, k5, . . . , kN−2, kN−1, kN holds the cone C above the plane conductive element P to form the monocone antenna.

The electromagnetic wave radiated by the monocone antenna is confined in an anechoic chamber CH consisting of a first face of the plane element P, the external surface of the conductive part C and a wall covered with absorbents Ab surrounding the part C. The height H of the wall covered with absorbents is for example equal to 2.5 m and the opening angle $\theta_o$ of the conical part is for example equal to 47°.

The electrically conductive plane element P is furnished with a through hole wherein a first end of the coaxial cable CX is housed, the second end whereof is connected to the electromagnetic wave source. The first end of the coaxial cable is attached using mechanical means M to the second face of the plane element, situated opposite the first face. The central wire of the coaxial cable CX is raised by a small height above the first face of the plane element P and is electrically connected to the end of the cone-shaped conductive part C. The plane conductive part P is the ground of the monocone antenna. In this way, the ground wire of the coaxial cable is electrically connected to the plane conductive element P. According to the embodiment represented in FIG. 1, the conductive ground braid of the coaxial cable is directly connected to the plane element P, preferentially by welding, at the first end of the coaxial cable. According to further embodiments of the invention (see FIG. 2), the conductive ground braid of the coaxial cable is electrically connected to the ground of a connector belonging to the mechanical means M.

The sensor CP for which the gain curve is to be determined is positioned, for example, on the first face of the plane element P at a distance D from the cone axis equal, for example, to 1.5 m. The sensor CP has the output thereof connected to the measurement system, via a coaxial cable K. According to one enhancement of the invention, the sensor CP is positioned on a motorised revolving plate PT. The coaxial cable K is then equipped with a rotary seal JT and the revolving plate PT is controlled by a control signal output by a computer PC. It is then possible to modify the incidence of the electromagnetic wave onto the sensor CP.

Figure 2:
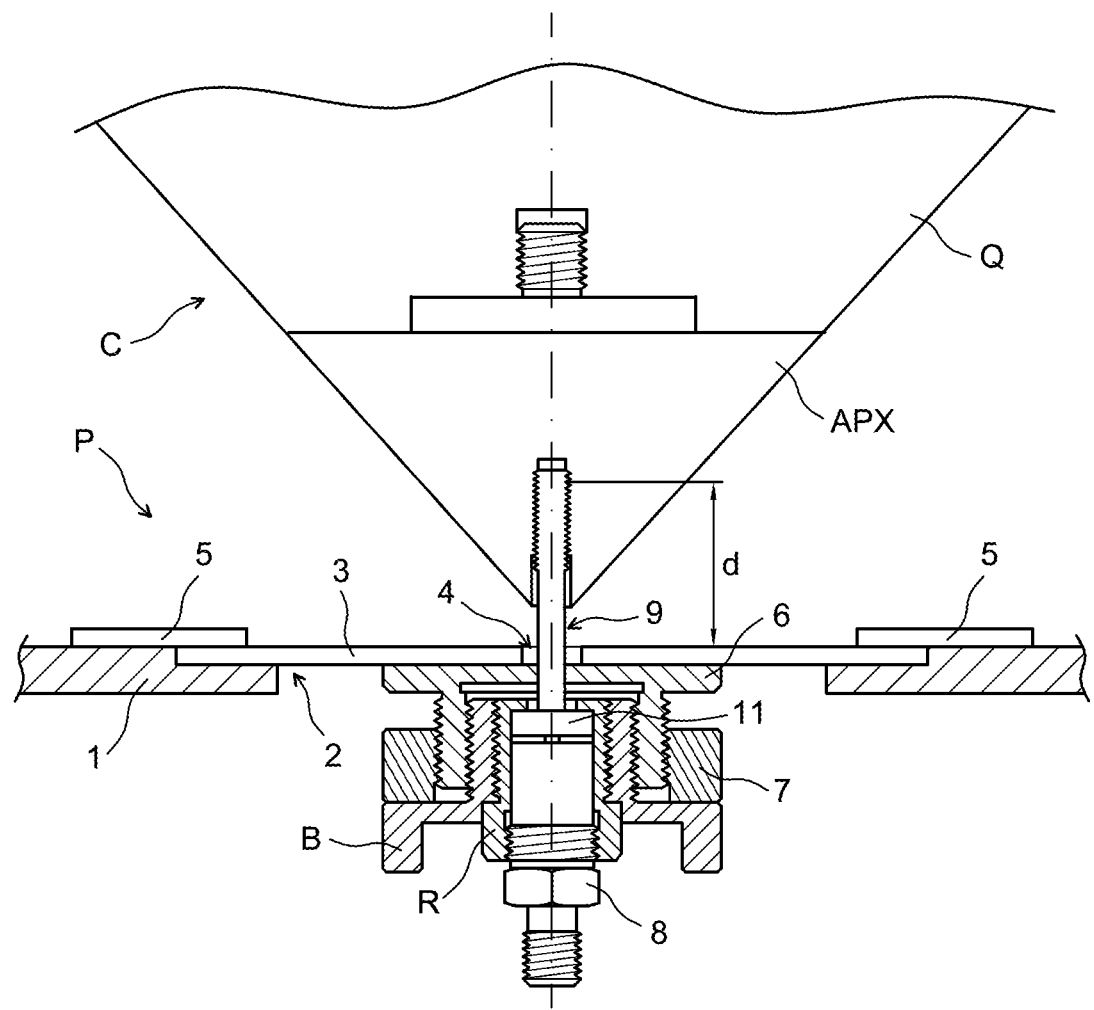
FIG. 2 represents the preferential embodiment of a mechanical structure included in the device for measuring electromagnetic field gain according to the invention.

FIG. 2 represents the preferential embodiment of a mechanical structure included in the device for measuring electromagnetic field sensor gain according to the invention. More particularly, FIG. 2 represents the mechanical and electrical connection existing between the coaxial cable and the apex of the conical part C.

The cone C consists of a cone body Q attached by screwing to a cone apex APX. The plane conductive element P consists of a plate 1 furnished with an opening 2 wherein a flexible metal foil 3 is attached. The flexible foil 3, for example a copper foil, is perforated at the centre thereof by an opening 4 positioned facing the end of the cone apex. A first face of the plate 1 and a first face of the flexible foil 3 define the first face of the plane conductive element P. The thickness of the plate 1 is for example equal to 5 mm and the thickness of the foil 3 for example equal to 0.5 mm. A metallic adhesive tape 5 attaches the first face of the plate 1 to the first face of the flexible foil 3.

The mechanical means M attaching the cable to the plane conductive element P comprise a metal part 6, a setting ring B, a connector pickup part R, a lock-nut 7, a connector 8 and a spacer 11. The metal part 6 comprises a plane part which is attached, for example by welding, to the second face of the metal foil 3 situated opposite the first face. The plane part of the metal part 6 is furnished with an opening which is aligned with the opening 4. The metal part 6 also comprises, from the plane part, a hollow cylindrical part surrounding the opening made in the plane part and successively housing, from the hollow cylindrical part, the setting ring B, the pickup part R, the connector 8 and the spacer 11.

Moreover, the central wire of the connector 8 is electrically connected to the end of the cone C by an electrical connection part 9. The electrical connection part 9 is raised by a distance d above the first face of the metal foil.

Figure 3:
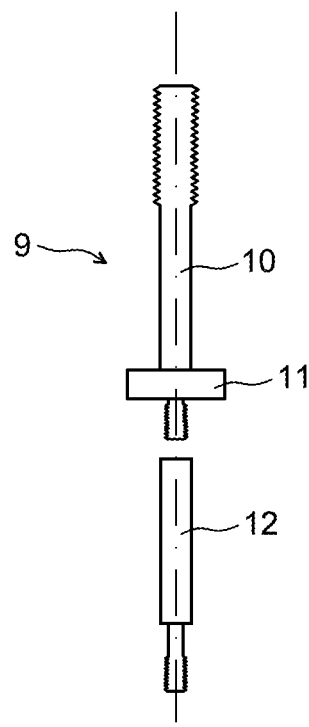
FIG. 3 represents a particular mechanical part included in the mechanical structure in FIG. 2.

FIG. 3 represents an exploded view of the electrical connection part 9. The electrical connection part 9 comprises two rod-shaped elements 10, 12 inserted into each other to form a single element wherein both ends are threaded. The electrical connection part 9 is attached to the end of the cone C by screwing the threaded end of the part 10 inside the end of the cone apex APX. The connection part 9 is attached to the central wire of the connector 8 by screwing the threaded end of the part 12 to the central wire of the connector 8. For the purposes of convenient assembly (see FIG. 4E), the spacer 11 is mounted on the rod-shaped element 10, in the vicinity of the connection between the parts 10 and 12.

Figure 4A:
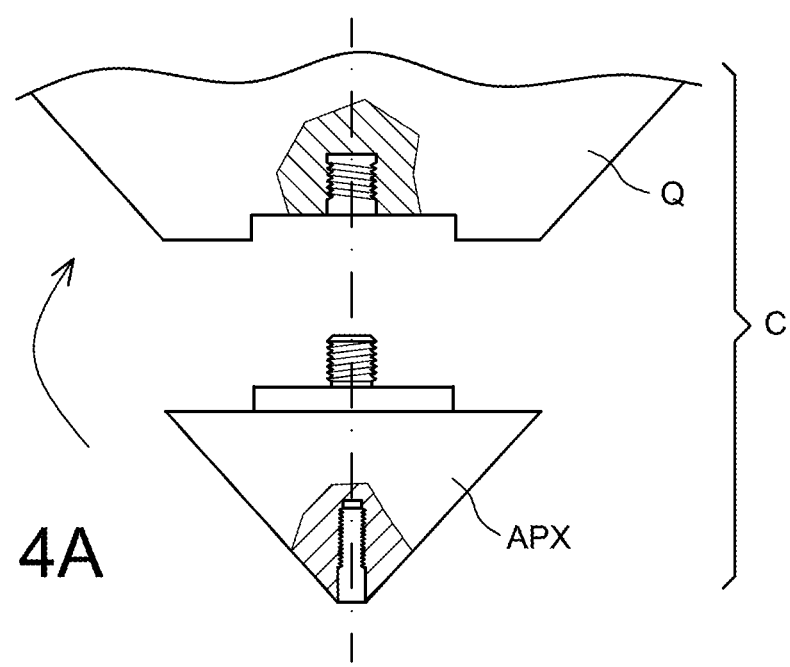
FIGS. 4A-4E represent various steps of production of the structure represented in FIG. 2.
Figure 4B:
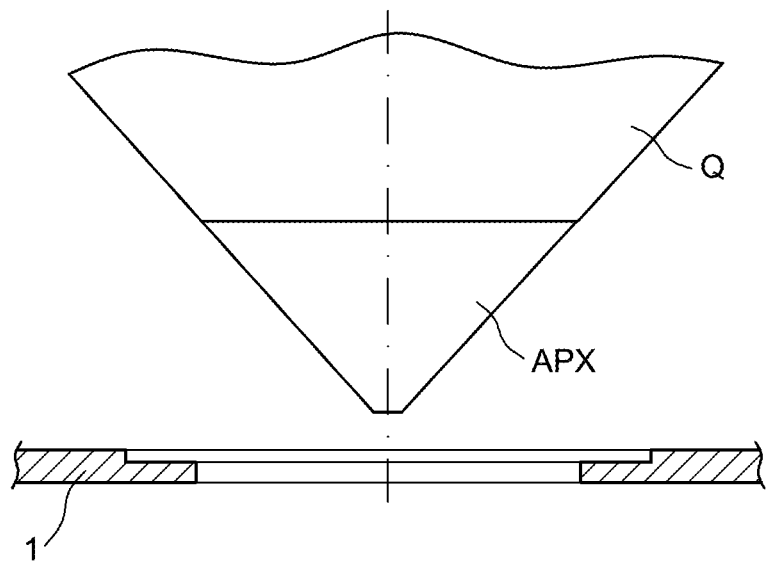
Figure 4C:
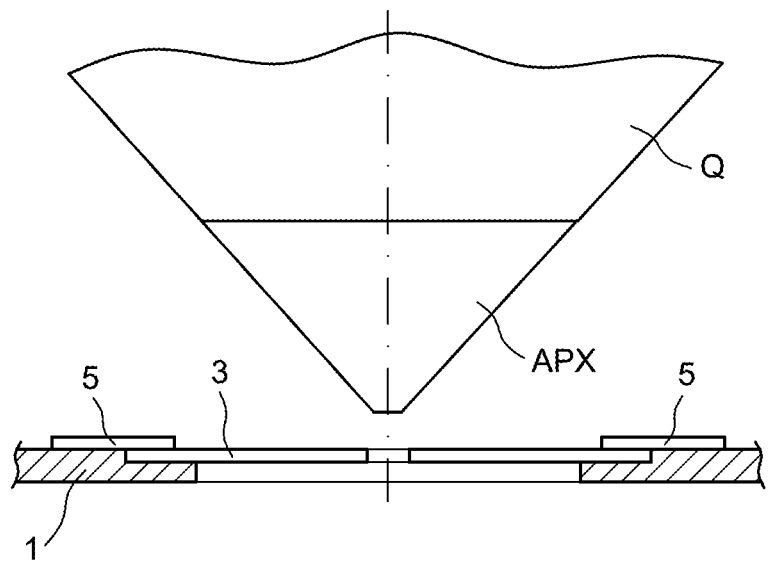
Figure 4D:
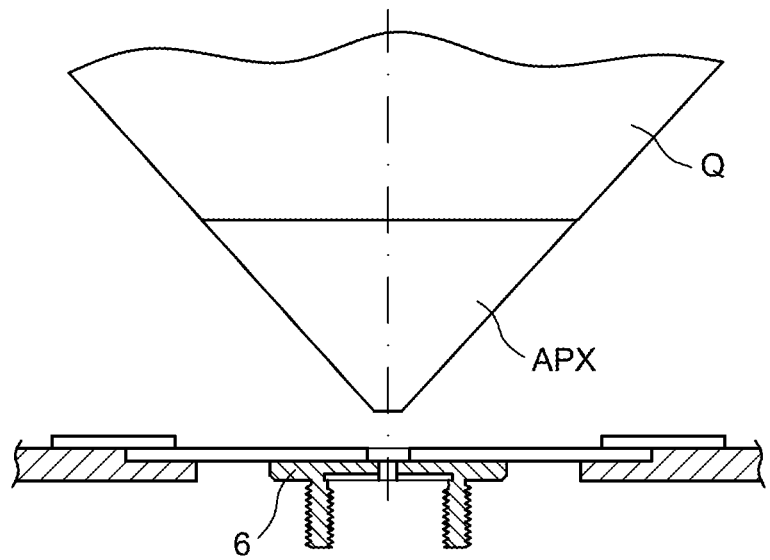
Figure 4E:
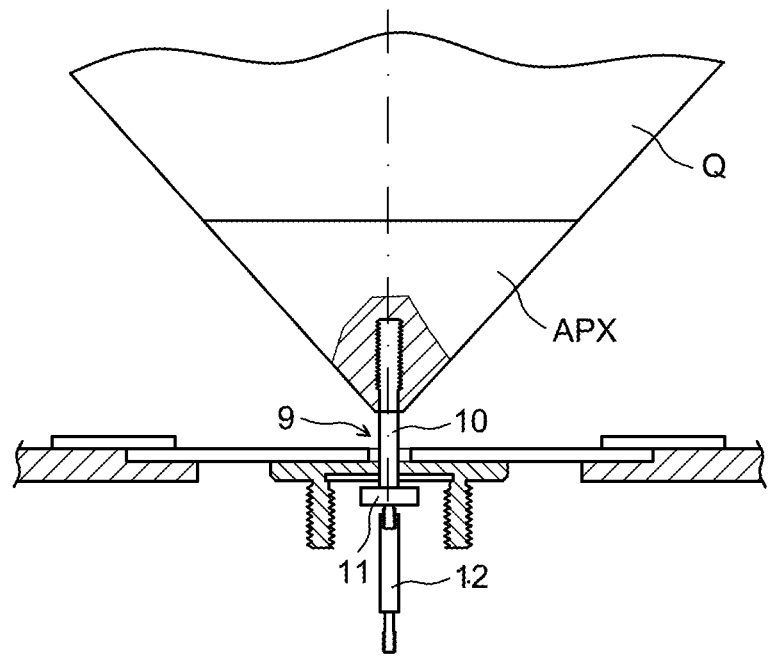

FIGS. 4A-4E represent various steps of production of the structure represented in FIG. 2. These various steps are as follows:

Attaching by screwing the apex APX and the body Q of the cone (FIG. 4A);

Positioning the cone above the opening made in the plane conductive element P using the cable suspension system (FIG. 4B);

Attaching the flexible foil 3 to the first face of the plane conductive element P using metallic adhesive tape 5 (FIG. 4C);

Attaching by welding the metal part 6 to the flexible foil 3 (FIG. 4D);

Attaching by screwing the electrical connection part 9 to the end of the apex APX of the cone (FIG. 4E).

Once the electrical connection part 9 has been attached to the cone C, the lock-nut 7 is screwed onto the external cylindrical part of the part 6 and the setting ring B is screwed onto the internal cylindrical part of the part 6. The connector pickup R is then screwed to the setting ring B. Then the external part of the connector 8 is screwed onto the connector pickup R while the central wire of the connector 8 is screwed to the threaded end of the rod-shaped part 12. The final positioning of the connector 8 is performed using the setting ring B. The lock-nut 7 is suitable for locking the position of the ring B and, accordingly, the connector, once an optimal connector position has been found.

Advantageously, the presence of the flexible metal foil is suitable for damping the relative movements of the conical part C and the plane element P, both during the operation for attaching the cone to the coaxial cable and subsequently, when the gain measurement device is operating.

Figure 5:
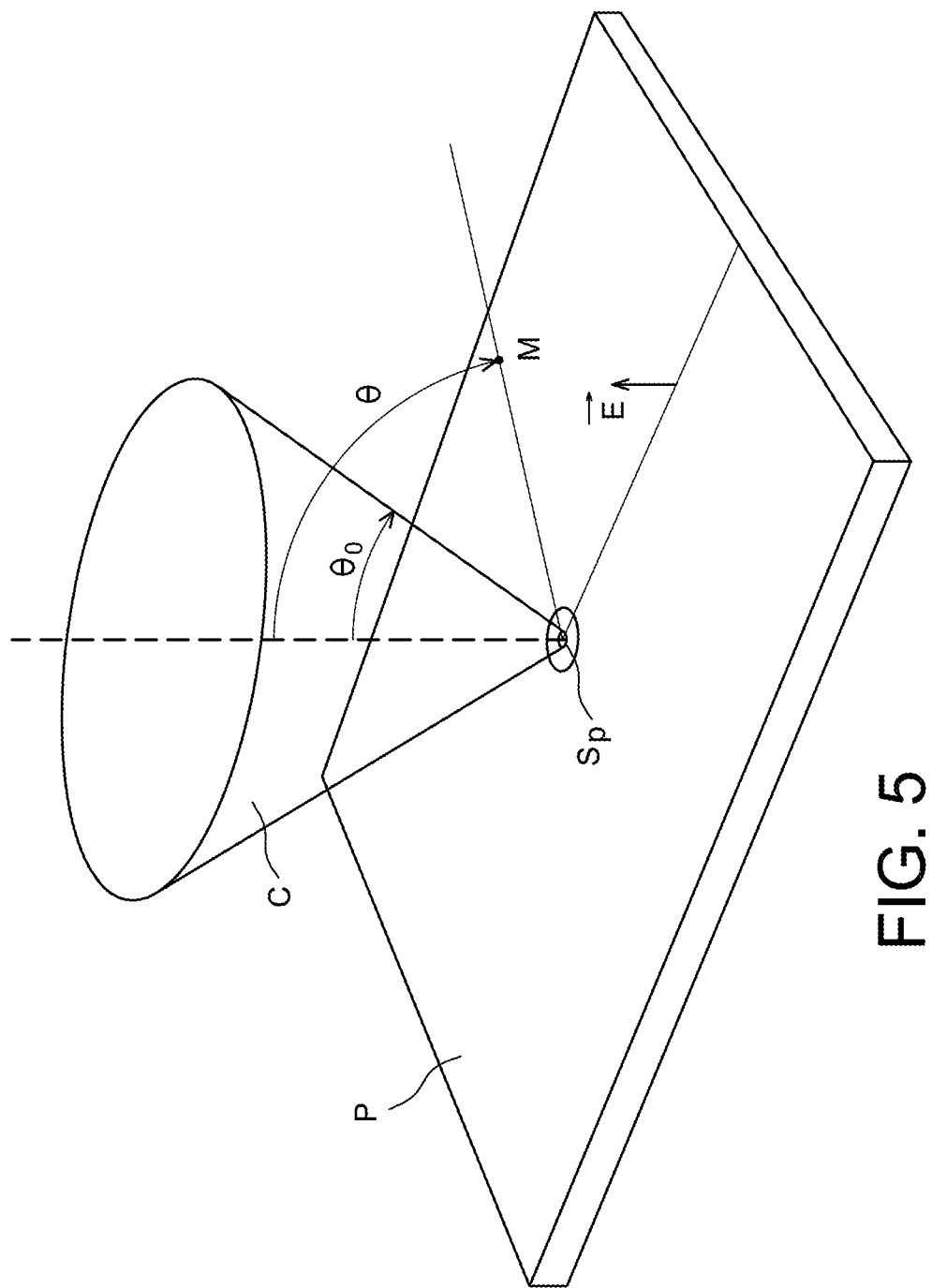
FIG. 5 represents the schematic diagram of a monocone antenna.

FIG. 5 represents the schematic diagram of a monocone antenna.

As noted above, the monocone antenna consists of a revolving cone-shaped hollow metal part C wherein the apex is in contact with a point source Sp which is surrounded, as closely as possible, by a plane conductive element P perpendicular to the axis of the cone C.

In a manner known per se, an electromagnetic wave propagating from the point source Sp is then guided between the external surface of the cone-shaped metal part C and the plane metal element P.

The amplitude E of the electrical field present at a point M situated a distance r away from the source, along an axis creating an angle θ relative to the cone axis, is given by the equation:

$$E = \frac{V e}{r \sin\theta \operatorname{Ln}\left(\operatorname{cotg}\left[\frac{\theta_o}{2}\right]\right)}$$

where:

$V_e$ is the amplitude of the incident voltage applied at the monocone antenna input and $\theta_o$ the opening angle of the cone.

The voltage gain $|S_{21}|$ of the antenna is expressed as:

$$|S_{21}| = \frac{V_S}{V_e}$$

where $V_S$ is the amplitude of the sensor output voltage and $V_e$ the amplitude of the incident voltage applied at the monocone antenna input, as mentioned above.

It is thus possible to write:

$$E = \frac{V_S}{r \sin\theta \operatorname{Ln}\left(\operatorname{cotg}\left[\frac{\theta_o}{2}\right]\right) |S_{21}|}$$

The opening $\theta_o$ of the conical part is preferentially equal to 47°. The amplitude $E_D$ of the electrical field measured by the sensor on the surface of the plane element P, at a distance D from the cone axis is thus expressed as:

$$E_D = \frac{V_S}{0.8328 |S_{21}| D}$$

In a manner known per se, the sensor gain G is expressed, as a function of the wavelength λ of the electromagnetic wave and the effective area $A_{eff}$:

$$G = \frac{4\pi A_{eff}}{\lambda^2}$$

It is also known that:

$$\frac{|E|^2}{377} = \frac{|V_S|^2 4\pi}{50 G \lambda^2}$$

Consequently, this gives:

$$G = \frac{377}{450} \frac{4\pi D 0.8328 f |S_{21}|^2}{10^{16}}$$

where f is the frequency of the electromagnetic wave radiated by the monocone antenna. It is then possible to display the curve of the gain G as a function of the frequency f of the electromagnetic wave.

The device according to the invention is advantageously suitable for making gain measurements over very broad frequency bands, for example the 100 MHz-40 GHz band.

Using the revolving plate PT, it is also advantageously possible to measure the gain based on the incidence of the wave on the sensor.

Figure 6:
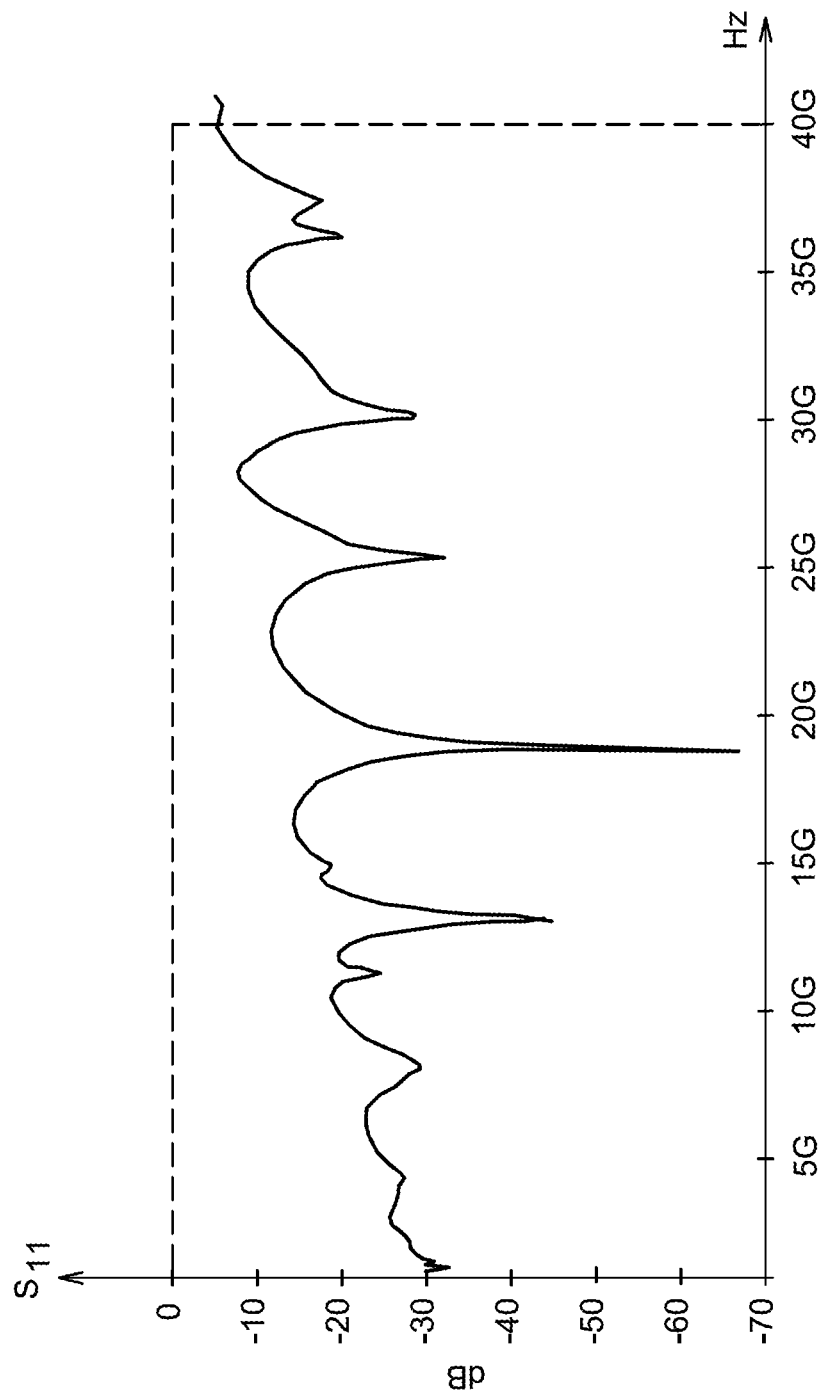
FIG. 6 represents an example of measurement of the reflection coefficient of a monocone antenna according to the invention.

FIG. 6 represents an example of measurement of the reflection coefficient of the device for measuring the gain of an electromagnetic field sensor according to the invention, over the 200 MHz-40 GHz frequency band. It appears that the reflection coefficient $S_{11}$ (expressed in decibels) varies by substantially −30 dB to −15 dB in the 200 MHz-20 GHz band and by −15 dB to −5 dB in the 20 GHz-40 GHz band. Such a measurement result confirms the excellent performances of the device for measuring gain according to the invention over very broad frequency bands, compared to the devices for measuring gain according to the prior art.

What is claimed is:

1. Device for measuring electromagnetic field sensor (CP) gain comprising an electromagnetic wave source and an antenna connected to the electromagnetic wave source and radiating an electromagnetic field in the direction of the sensor, characterised in that:

the antenna is a monocone antenna comprising a plane conductive element (P) having a first face and a second face opposite the first face and a cone-shaped conductive part (C) situated on the side of the first face, the plane conductive element (P) consisting of a plate (1) furnished with an opening (2) wherein a flexible metal foil (3) furnished with an opening (4) is attached, the flexible foil (3) having a first face and a second face, the first face and the second face of the flexible metal foil (3) being respectively situated on the side of the first face and on the side of the second face of the plane conductive element (P), the cone-shaped conductive part comprising a cone body (Q) and a cone apex (APX) attached to the cone body (Q), one end of the cone apex being positioned facing the opening of the metal foil, the first face of the plane conductive element and an external face of the cone-shaped conductive part defining, with a wall covered with absorbent included in the measurement device and surrounding the cone-shaped part, an anechoic chamber wherein the sensor is positioned, an electrical connection part (9) traverses the opening (4) of the flexible metal foil (3) and has a first end attached in the end of the cone apex and a second end attached to a first end of a coaxial cable (CX) attached to the second face of the flexible metal foil by mechanical means (M), the second end of the coaxial cable (CX) being connected to the electromagnetic wave source, a cable suspension system (k1, k2, . . . , kN) holds the cone-shaped conductive part above the plane conductive element (P), a system for measuring voltage (MT) connected to the sensor is suitable for measuring a voltage output by the sensor, and a computing device (CA) connected to the voltage measurement system (MT) is suitable for computing a sensor gain (G) on the basis of the voltage measurements output by the voltage measurement system.

2. Device according to claim 1, wherein the mechanical means (M) comprise a connector (8) electrically connected to the end of the coaxial cable, the connector (8) having a central wire attached to the second end of the electrical connection part (9).

3. Device according to claim 1, wherein the flexible metal foil (3) is attached to the plane conductive element (P) by a metallic adhesive tape (5).

4. Device according to claim 1, wherein the plane conductive element (P) is furnished with a revolving plate (PT) whereon the sensor is positioned.

5. Device according to claim 1, wherein the cone-shaped conductive part (C) consists of two separable parts screwed onto each other, a first part comprising the apex of the cone and the second part forming the body of the cone.

* * * * *